United States Patent

Gatterbauer et al.

(10) Patent No.: US 9,082,626 B2
(45) Date of Patent: Jul. 14, 2015

(54) CONDUCTIVE PADS AND METHODS OF FORMATION THEREOF

(71) Applicant: Infineon Technologies AG, Neubiberg (DE)

(72) Inventors: Johann Gatterbauer, Parsberg (DE); Bernhard Weidgans, Bernhardswald (DE)

(73) Assignee: Infineon Technologies AG, Neubiberg (DE)

( * ) Notice: Subject to any disclaimer, the term of this patent is extended or adjusted under 35 U.S.C. 154(b) by 27 days.

(21) Appl. No.: 13/952,080

(22) Filed: Jul. 26, 2013

(65) Prior Publication Data

US 2015/0028461 A1   Jan. 29, 2015

(51) Int. Cl.
*H01L 23/00* (2006.01)
*H01L 23/495* (2006.01)

(52) U.S. Cl.
CPC .......... *H01L 24/05* (2013.01); *H01L 23/49575* (2013.01); *H01L 24/03* (2013.01); *H01L 24/34* (2013.01); *H01L 2224/05556* (2013.01)

(58) Field of Classification Search
CPC ...................................................... H01L 24/06
USPC ........................................................ 438/614
See application file for complete search history.

(56) References Cited

U.S. PATENT DOCUMENTS

| 2007/0228561 | A1* | 10/2007 | Matsuki et al. | 257/737 |
| 2008/0246156 | A1* | 10/2008 | Bae | 257/762 |
| 2009/0102021 | A1* | 4/2009 | Chen et al. | 257/621 |
| 2009/0140244 | A1* | 6/2009 | Lehr et al. | 257/48 |
| 2010/0181650 | A1* | 7/2010 | Shigihara et al. | 257/620 |
| 2011/0092000 | A1* | 4/2011 | Coffy | 438/15 |

* cited by examiner

*Primary Examiner* — Lex Malsawma
(74) *Attorney, Agent, or Firm* — Slater & Matsil, L.L.P.

(57) ABSTRACT

In one embodiment, a device includes a first conductive pad disposed over a substrate, and a etch stop layer disposed over a top surface of the first conductive pad. The device further includes a solder barrier disposed over the etch stop layer.

19 Claims, 6 Drawing Sheets

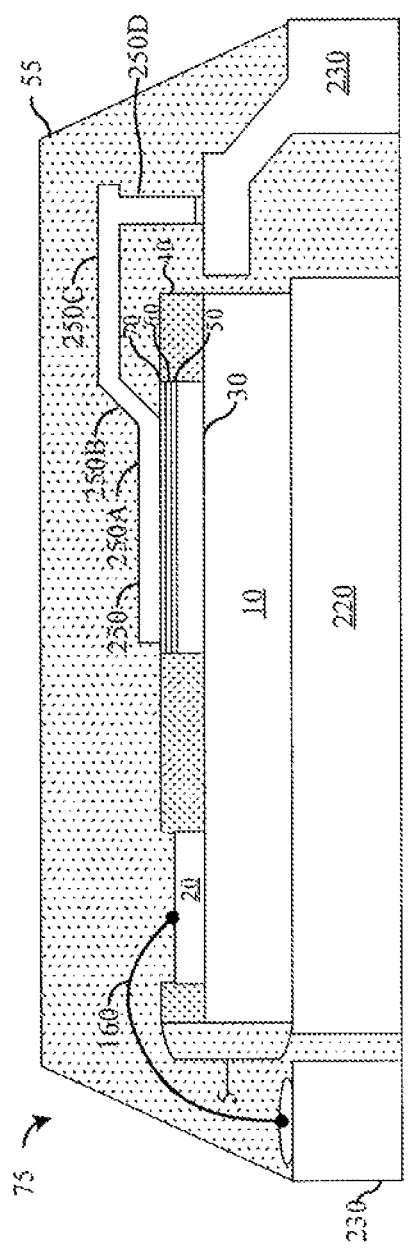
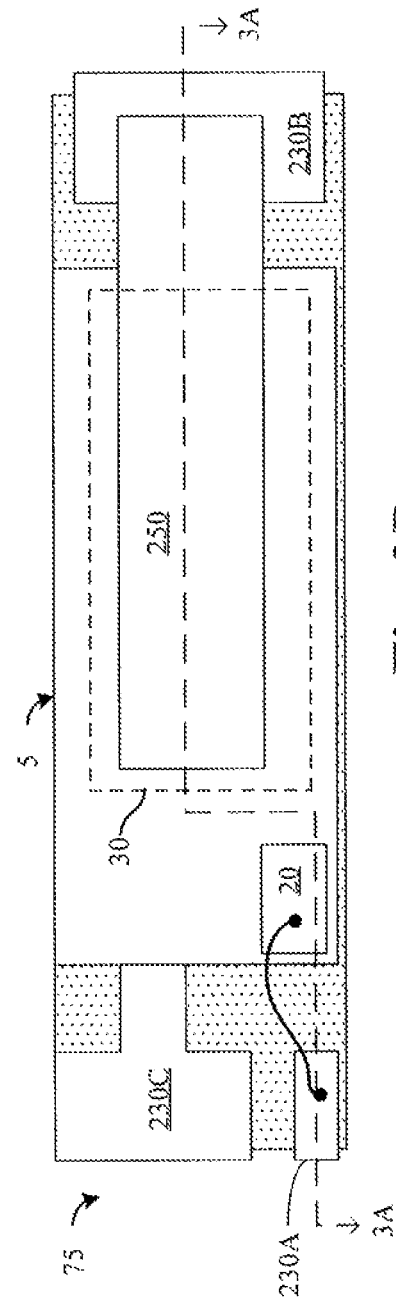
*Fig. 3A*
*Fig. 3B*

US 9,082,626 B2

CONDUCTIVE PADS AND METHODS OF FORMATION THEREOF

TECHNICAL FIELD

The present invention relates generally to contacts, and more particularly to conductive pads and methods of formation thereof.

BACKGROUND

Semiconductor devices are used in many electronic and other applications. Semiconductor devices comprise integrated circuits or discrete devices that are formed on semiconductor wafers by depositing many types of thin films of material over the semiconductor wafers, and patterning the thin films of material to form the integrated circuits.

The semiconductor devices are typically packaged within a ceramic or a plastic body to protect the semiconductor devices from physical damage or corrosion. The packaging also supports the electrical contacts required to connect a semiconductor device, also referred to as a die or a chip, to other devices external to the packaging. Many different types of packaging are available depending on the type of semiconductor device and the intended use of the semiconductor device being packaged. Depending on the package type semiconductor chips may be connected to external circuitry through different types of interconnects such as bond wires, clips, plates, and others. These interconnects are coupled to conductive pads on the surfaces of the semiconductor chips.

One of the concerns of packaging relates to the minimization of parasitic effects. This is because packaging can dramatically alter the performance of the semiconductor chip within because of parasitic resistances, inductances, and others. To minimize parasitic effects, semiconductor chips having different types of conductive pads may be used.

SUMMARY OF THE INVENTION

In accordance with an embodiment of the present invention, a device comprises a first conductive pad, which is disposed over a substrate and a etch stop layer is disposed over a top surface of the first conductive pad. The device further comprises a solder barrier layer disposed over the etch stop layer, and a solder metal layer disposed over the solder barrier layer.

In accordance with an alternative embodiment of the present invention, a package comprises a stacking comprising a first substrate and a second substrate. A wire bond is coupled to a first conductive pad on the second substrate. A connector is coupled to a second conductive pad on the second substrate. The connector is soldered to the second conductive pad. A etch stop layer is disposed between the connector and the second conductive pad.

In accordance with an alternative embodiment of the present invention, a method of forming a device comprises forming a first conductive pad and a second conductive pad over a substrate, forming a etch stop layer over the first conductive pad and the second conductive pad, and forming a solder layer over the etch stop layer. The solder layer is removed from over the first conductive pad using a first etch process. The etch stop layer is removed from over the first conductive pad using a second etch process. The second etch process selectively removes the etch stop layer relative to the underlying first conductive pad.

BRIEF DESCRIPTION OF THE DRAWINGS

For a more complete understanding of the present invention, and the advantages thereof, reference is now made to the following descriptions taken in conjunction with the accompanying drawing, in which:

FIG. 3, which includes FIGS. 3A and 3B, illustrates a semiconductor package in accordance with an embodiment of the present invention, wherein FIG. 3A illustrates a cross-sectional view and FIG. 3B illustrates a top view;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
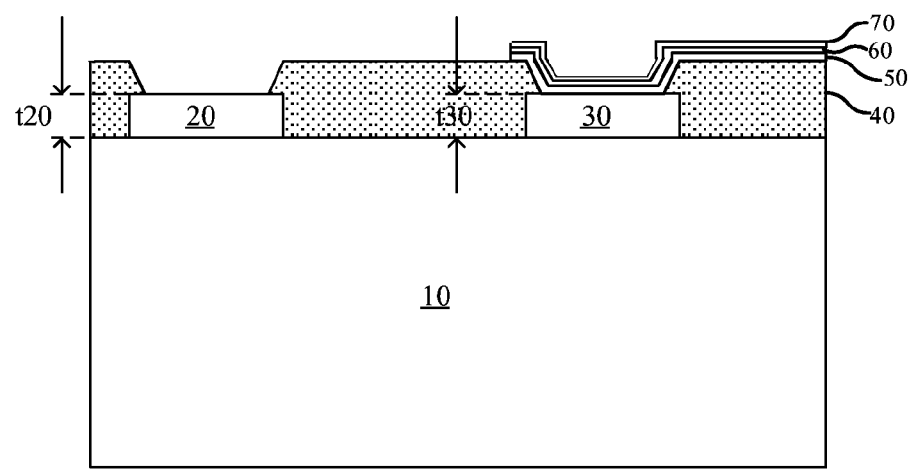
FIG. 1 illustrates a cross-sectional view of a device in accordance with an embodiment of the present invention.

FIG. 1 illustrates a cross-sectional view of a device in accordance with an embodiment of the present invention.

Referring to FIG. 1, the device may be a semiconductor device, a circuit board, a device carrier, and/or other devices in various embodiments. The device includes a substrate 10. The substrate 10 may be a semiconductor substrate, an insulating substrate, and/or a combination of semiconducting and insulating layers.

In various embodiments, at least one surface of the substrate 10 includes two different types of conductive pads. In one embodiment, a first conductive pad 20 is a pad configured to be wire bonded while a second conductive pad 30 is configured to be soldered. In various embodiments, the conductive pads may be configured to be wire bonded, soldered, pressure bonded, wedge bonded, anodic bonded, and attached using other techniques. Alternatively, one of the conductive pads may be a probe pad while another of the conductive pad may be a solderable pad.

In various embodiments, the conductive pads are disposed in an insulating layer 40. In one embodiment, the insulating layer 40 may be a polyimide layer. In alternative embodiments, the insulating layer 40 comprises a suitable resin layer, or other layers, for example, stress relieving layers configured to prevent stress induced defects and contamination from external compounds such as molding compounds.

In various embodiments, the conductive pads may comprise aluminum or copper pads. In one or more embodiments, the conductive pads may comprise a pure metal, which may include trace impurities, as well as alloys of a metal with another material. In various embodiments, a under bump metallization layer is disposed over the second conductive pad 30.

In one or more embodiments, the under bump metallization layer may comprise an etch stop layer 50, an adhesion layer 65 (see FIG. 12), a solder metal barrier layer 60, and a solder metal layer 70. In various embodiments, the etch stop layer 50 comprises a conductive material, and may comprise tungsten in one embodiment and titanium and tungsten in another embodiment. In one or more embodiments, the adhesion layer 65 (see FIG. 12) comprises titanium. In some embodiments, the adhesion layer 65 (see FIG. 12) may be skipped.

The solder metal barrier layer 60 may be configured to prevent the solder metal from diffusion into the conductive pads and also as a solder wettable layer in some embodiments. In some embodiments, the solder metal barrier layer 60 may comprise nickel and vanadium, for example, a NiV alloy layer. In other embodiments, the solder metal barrier layer 60 may comprise other composition including a pure nickel layer.

The solder metal layer 70 may be configured to form a solder with another material being attached. The solder metal layer 70 may comprise silver in one embodiment. In other embodiments, the solder metal layer 70 may comprise other solder materials such as copper, Pb—Sn, and others. Thus, the top surface of the solder metal layer 70 over the second conductive pad 30 provides a surface for forming a solder joint with another substrate.

As illustrated in FIG. 1, the first thickness t20 of the first conductive pad 20 may be the same as the second thickness t30 of the second conductive pad 30 in various embodiments. This is because of the selectivity provided by the etch stop liner 50 as will be described further below.

Figure 2:
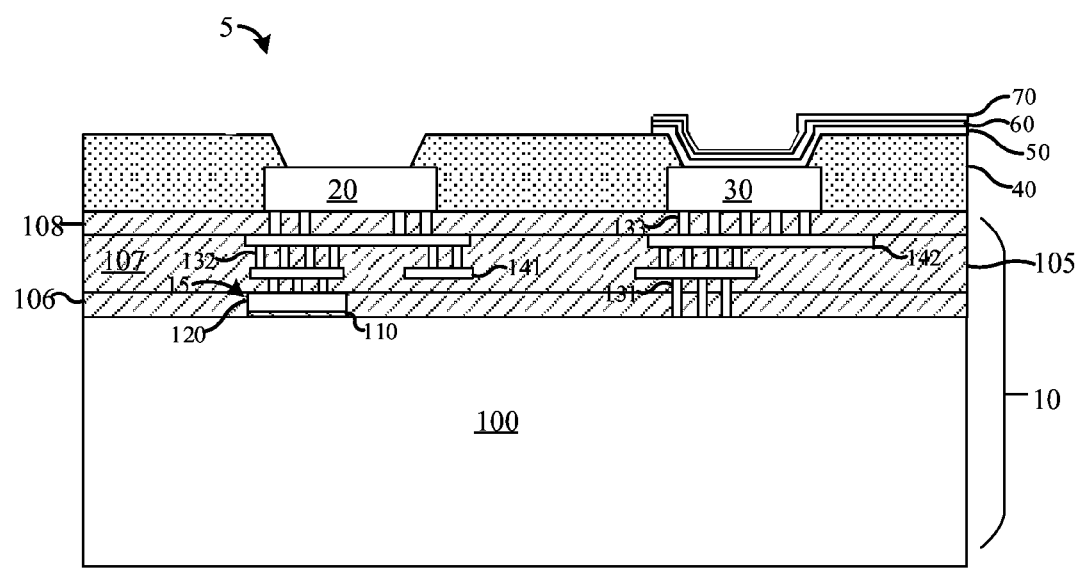
FIG. 2 illustrates a cross-sectional view of a semiconductor device in accordance with an embodiment of the present invention.

FIG. 2 illustrates a cross-sectional view of a semiconductor device in accordance with an embodiment of the present invention.

In one or more embodiments, the semiconductor device may be a semiconductor chip 5 and may comprise a substrate 10 including a semiconductor substrate 100, and a plurality of insulating layers. The plurality of insulating layers may comprise multiple metallization layers. In one or more embodiments, the first conductive pad 20 may be coupled to a first region of the substrate 10 while the second conductive pad 30 may be coupled to a second region of the substrate 10.

The semiconductor substrate 100 may be a silicon substrate in one embodiment. Alternatively, in other embodiments, the semiconductor chip 5 may have been formed on silicon carbide (SiC), germanium, sapphire, and other substrate. Accordingly, in various embodiments, the semiconductor substrate 100 may comprise a silicon substrate, silicon on insulator substrate, a compound semiconductor substrate. The semiconductor substrate 100 may include epitaxial layers, which may also include hetero-epitaxial layers. In one embodiment, the semiconductor chip 5 is a device formed at least partially on gallium nitride (GaN), which may be a GaN on sapphire or silicon substrate.

In various embodiments, the semiconductor chip 5 may comprise a power semiconductor device, which may be a discrete device in one embodiment. In one embodiment, the semiconductor chip 5 is a two terminal device such as a PIN diode or a Schottky diode. In one or more embodiments, the semiconductor chip 5 is a three terminal device such as a power metal insulator semiconductor field effect transistor (MISFET), a junction field effect transistor (JFET), bipolar junction transistor (BJT), an insulated gate bipolar transistor (IGBT), or a thyristor. In various embodiments, the semiconductor chip 5 may comprise a power chip, which, for example, draw large currents (e.g., greater than 30 amperes). In various embodiments, the semiconductor chip 5 may comprise a discrete vertical device such as a two or a three terminal vertical power device. In various embodiments, the semiconductor chip 5 may be a vertical semiconductor device configured to operate at about 20 V to about 1000 V.

In one embodiment, the first conductive pad 20 is coupled to a gate terminal while the second conductive pad 30 is coupled to a source terminal of a discrete transistor. The current through the gate terminal is smaller relative to the source terminal. Therefore, the gate terminal may be coupled to external circuitry through a bond wire while the second conductive pad is coupled through a thicker solderable interconnect.

The thickness of the semiconductor chip 5 from the top surface to the opposite bottom surface may be less than 50 μm in various embodiments. The thickness of the semiconductor chip 5 from the top surface to the bottom surface may be less than 20 μm in one or more embodiments. The thickness of the semiconductor chip 5 from the top surface to the bottom surface may be less than 10 μm in one or more embodiments.

A set of metallization layers 105 is disposed over the semiconductor substrate 100, which may comprise one or more levels of metal lines and vias in various embodiments. For example, the metallization layers 105 may comprise ten or more metal levels in one embodiment. In another embodiment, the metallization layers 105 may comprise three metal layers. In another embodiment, the metallization layers 105 may comprise four or more metal levels. The metallization layers 105 may couple various devices within the semiconductor chip 5 in one embodiment. In another embodiment, the metallization layers 105 form contacts to different regions of a discrete semiconductor device.

In various embodiments, the first conductive pad 20 and the second conductive pad 30 are coupled to active devices in the substrate 10 such as a first device 15. The first device 15 may be a transistor, capacitor, diode, thyristor, and other devices in various embodiments. In one embodiment, the first device 15 is a discrete transistor. The first conductive pad 20 and the second conductive pad 30 may be a top metallization layer of a multilevel metallization in one embodiment. A plurality of metal lines and vias disposed within the metallization layers 105 may couple the active devices in the substrate 10 with the first conductive pad 20 and the second conductive pad 30.

FIG. 2 illustrates a two layer metallization having a first via level 131, a first metal level 141, a second via level 132, a second metal level 142 coupled to the first conductive pad 20 and the second conductive pad 30 through third via level 133. In one embodiment, the first conductive pad 20 and the second conductive pad 30 are a metal level formed on the uppermost metal level of the semiconductor chip 5.

Each of the metallization level may include an inter-level dielectric layer. For example, a first inter-level dielectric layer 106 is deposited over the semiconductor substrate 100. A second inter-level dielectric layer 107 is deposited over the first inter-level dielectric layer 106. A third inter-level dielectric layer 108 is deposited over the second inter-level dielectric layer 107. The inter-level dielectric layers may be separated from each other by etch stop liners.

In the illustrated embodiments, the conductive features forming the metal lines and vias may be formed using a dual damascene process. In alternative embodiments, the conductive features may be formed using a damascene process or a combination of single and dual damascene processes.

Each conductive feature may include a metal liner, which may include multiple layers. For example, the metal liner may include a first metal liner and a second metal liner in some embodiments. The first metal liner may be a diffusion barrier while the second metal liner may be a seed layer. The metal liner may be skipped at least partially in case aluminum is used as the conductive material. However, in case copper is used to form the conductive feature, a copper barrier and a copper seed layer may be deposited prior to depositing the copper using an electrochemical process. Aluminum conductive features may be deposited using a subtractive process.

An insulating layer 40 is formed over the substrate 10 comprising the semiconductor substrate 100. Additionally, as described in the prior embodiment, a under bump metallization layer comprising an etch stop layer 50, an adhesion layer 65 (FIG. 12), a solder metal barrier layer 60, and a solder metal layer 70 may be formed over the second conductive pad 30 but not the first conductive pad 20.

FIG. 3, which includes FIGS. 3A and 3B, illustrates a semiconductor package in accordance with an embodiment of the present invention, wherein FIG. 3A illustrates a cross-sectional view and FIG. 3B illustrates a top view.

Referring to FIG. 3A, the semiconductor package 75 comprises at least one semiconductor chip 5 embedded within an encapsulating material 55. The semiconductor chip 5 is disposed over a die paddle 220 of a (lead) frame, which has a plurality of leads 230 for contacting the semiconductor package. A clip 250 is disposed over the semiconductor chip 5 and is coupled to the second conductive pad 30. In various embodiments, the clip 250 is soldered to the second conductive pad 30. An additional solder metal may be applied to the solder metal layer 70 disposed over the second conductive pad 30 before attaching the clip 250.

In various embodiments, the clip 250 has a first portion 250A, a second portion 250B, a third portion 250C, and a fourth portion 250D. In various embodiments, the first portion 250A is configured to contact a contact pad on the semiconductor chip 5. In various embodiments, the first portion 250A may have a first width correlated to the width of the second conductive pad 30, the fourth portion 250D may have a second width for contacting a lead of the plurality of leads 230. The clip 250 may comprise copper in one embodiment. The clip 250 may be coated with a solder material in one or more embodiments. In alternative embodiments, the clip may comprise other conductive materials.

In various embodiments, one or more wire bonds 160 may couple other conductive pads on the semiconductor chip 5 to a lead of the plurality of leads 230.

The clip 250, the wire bonds 160, and the semiconductor chip 5 are embedded within the encapsulating material 55. In various embodiments, the encapsulating material 55 comprises a dielectric material and may comprise a mold compound in one embodiment. In other embodiments, the encapsulating material 55 may comprise a polymer, a biopolymer, a fiber impregnated polymer (e.g., carbon or glass fibers in a resin), a particle filled polymer, and other organic materials. In one or more embodiments, the encapsulating material 55 comprises a sealant not formed using a mold compound, and materials such as epoxy resins and/or silicones. In various embodiments, the encapsulating material 55 may be made of any appropriate duroplastic, thermoplastic, or thermosetting material, or a laminate. The material of the encapsulating material 55 may include filler materials in some embodiments. In one embodiment, the encapsulating material 55 may comprise epoxy material and a fill material comprising small particles of glass or other electrically insulating mineral filler materials like alumina or organic fill materials.

FIG. 3B illustrates a top view of a semiconductor package. The top view is one of the many embodiments of the cross-sectional view illustrated in FIG. 3A.

As illustrated in FIG. 3B, in one embodiment, the first conductive pad 20 is coupled to a gate lead 230A of the plurality of leads 230 through wire bonds 160. The second conductive pad 30 is coupled to a source lead 230B of the plurality of leads 230 through the clip 250. A drain lead 230C is coupled to the die paddle 220 and may be coupled to the drain contact of the semiconductor chip 5. Embodiments of the invention include single, dual, and quad lead designs. Embodiments of the invention include dual flat no-lead package, quad flat no-lead package, leadless leadframe package, leadless plastic chip carrier, micro-leadframe, and others. For example, in another embodiment, all the leads may be placed on one side of the die paddle. In various embodiments, the semiconductor package 75 may comprise any suitable type of package including through hole packages, surface mounted packages, etc.

Figure 4:
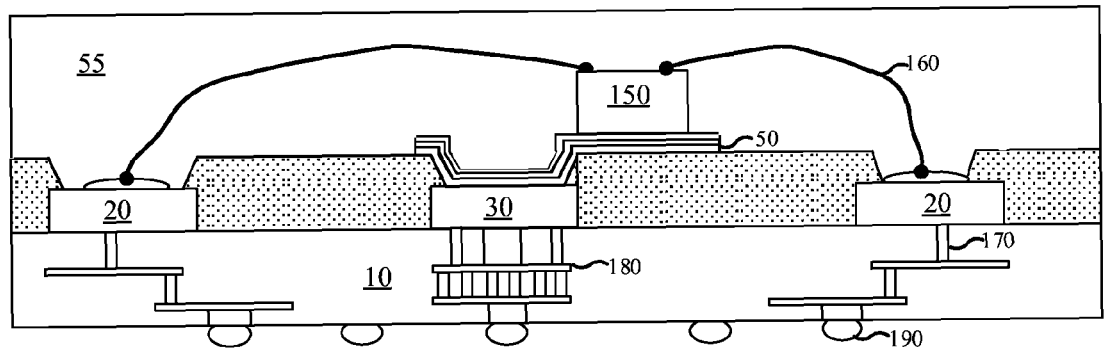
FIG. 4 illustrates an alternative embodiment of a substrate having multiple conductive pads in accordance with an embodiment of the present invention.

FIG. 4 illustrates an alternative embodiment of a substrate having multiple conductive pads in accordance with an embodiment of the present invention.

In various embodiments, the substrate 10 may be an insulating substrate. In one or more embodiments, the insulating substrate may include metal lines or vias. The insulating substrate has a front side on which a one or more semiconductor chips 5 may be mounted and a back side for connecting to external circuitry. For example, the front side of the insulating substrate may include one or more first conductive pads 20 and second conductive pads 30. The second conductive pad 30 may be used to mount a semiconductor chip 5.

As illustrated in FIG. 4, the semiconductor chip 5 is coupled to the second conductive pad 30 through the under bump metallization layer. In one embodiment, the contacts on one side of the semiconductor chip 5 may be coupled to one or more first conductive pads 20 through wire bonds 160. In contrast, another side of the semiconductor chip 5 may be soldered to the second conductive pad 30. The solder balls 190 on the back side of the substrate 10 may be used to couple the semiconductor chip 5 to external electrical circuitry. Thus, in this embodiment, the substrate 10 may be a insulating carrier such as a ball grid array substrate.

Figure 5:
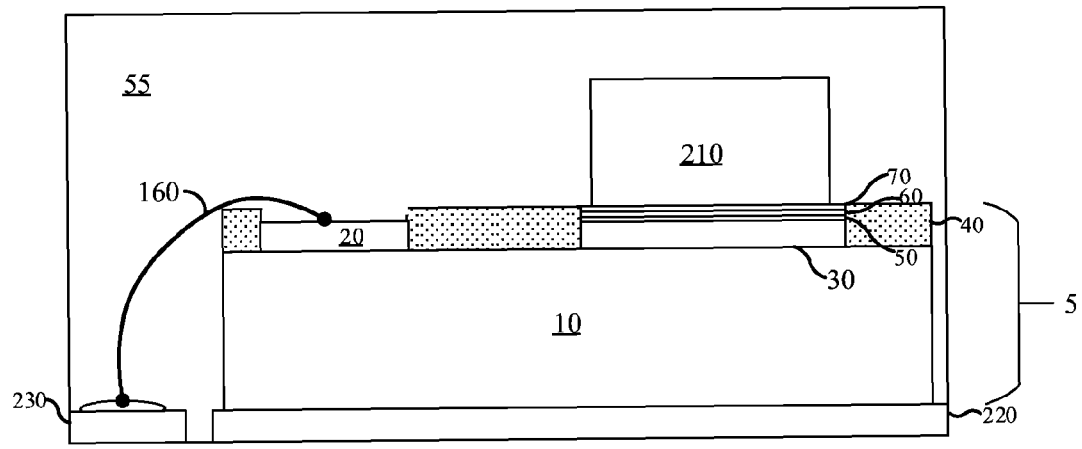
FIG. 5 illustrates a semiconductor package comprising a stacked chip in accordance with an embodiment of the present invention.

FIG. 5 illustrates a semiconductor package comprising a stacked chip in accordance with an embodiment of the present invention.

FIG. 5 illustrates a further alternative embodiment of a further chip 210 disposed on the semiconductor chip 5. The semiconductor chip 5 may be disposed over a lead frame comprising a die paddle 220 and a plurality of leads 230. The further chip 210 may be bonded to the second conductive pad 30, for example, using flip-chip bonding. The first conductive pad 20 on the semiconductor chip 5 may be coupled to the plurality of leads 230 using wire bonds 160. Additional clips or plates may be used to couple the semiconductor chip 5 to the plurality of leads 230.

FIGS. 6-11 illustrate a device during various stages of fabrication in accordance with embodiments of the present invention.

Figure 6:
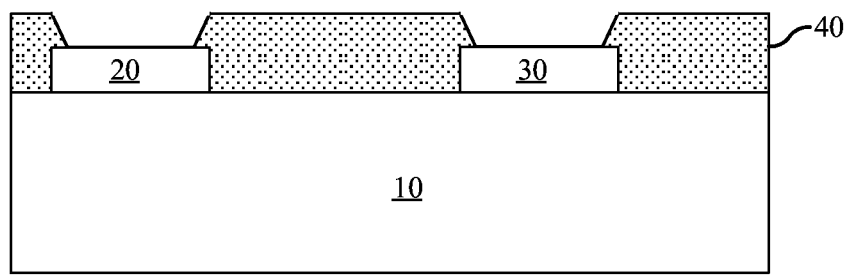
FIGS. 6-11 illustrate a device during various stages of fabrication in accordance with embodiments of the present invention.

In one embodiment, FIG. 6 illustrates a semiconductor device after all fabrication processes. The fabrication processes end with the formation of the plurality of chip contact pads. For example, a first conductive pad 20 and a second conductive pad 30 are exposed between an insulating layer 40. The insulating layer 40 may be a resin layer, a polyimide layer, a silicon oxide layer, a silicon nitride layer, and other suitable insulating material known to a person having ordinary skill in the art. As described in various embodiments, the substrate 10 may include a semiconductor substrate, an insulating substrate, and other types of carriers.

Figure 7:
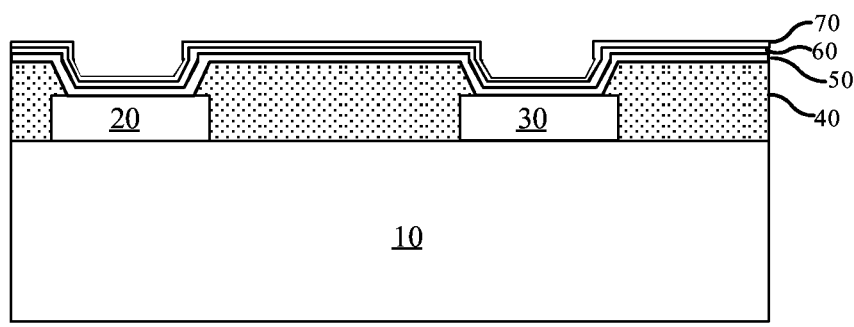

Referring to FIG. 7, a under bump metallization layer is formed over the substrate 10. In various embodiments, the under bump metallization layer is formed as a blanket layer. The under bump metallization layer may include one or more conductive layers. In one or more embodiments, the under bump metallization layer comprises a conductive etch stop layer 50, an adhesion layer 65 (FIG. 12), a solder metal barrier layer 60, and a solder metal layer 70. In various embodiments, the conductive etch stop layer 50 may be deposited using a sputtering process. In alternative embodiments, other deposition processes including chemical vapor deposition, physical vapor deposition, atomic layer deposition, evaporation, may be used. In one or more embodiments, the thickness of the conductive etch stop layer 50 after the deposition is about 10 nm to about 200 nm. In various embodiments, the etch stop layer 50 comprises an alloy comprising tungsten. In one embodiment, the etch stop layer 50 comprises an alloy comprising tungsten and titanium.

Next, the adhesion layer is deposited over the etch stop layer 50. The adhesion layer may be skipped in some embodiments. The adhesion layer may comprise titanium in one embodiment. For example, in one embodiment, a layer comprising essentially of pure titanium may be deposited over the etch stop layer 50.

Next, the solder metal barrier layer 60 is deposited over the adhesion layer 65 (if present) or the etch stop layer 50. The solder metal barrier layer 60 is selected to prevent the subsequent solder metal from diffusing into the second conductive pad 30 (e.g., into the semiconductor chip 5 in FIG. 2). The solder metal barrier layer 60 may be deposited using a sputtering process in one embodiment. In alternative embodiments, other deposition processes including chemical vapor deposition, physical vapor deposition, atomic layer deposition, evaporation, may be used. In various embodiments, the solder metal barrier layer 60 may comprise nickel, nickel vanadium, chromium, copper, and other suitable materials.

A solder metal layer 70 is deposited over the solder metal barrier layer 60. The solder metal layer 70 may comprise a single metal layer or a plurality of different metal layers in various embodiments. In one embodiment, the solder metal layer 70 comprises silver. In various embodiments, the solder metal layer 70 may comprise a lead free solder and may include copper, tin, zinc, manganese, bismuth, indium, antimony, and others. For example, in an alternative embodiment, the solder metal layer 70 may comprise copper, tin, silver, and manganese. In another embodiment, a lead solder may be used, for example, comprising lead and tin. Other examples for the solder metal layer 70 include SnPbAg, SnPb, PbAg, PbIn, and lead free materials such as SnBi, SnAgCu, SnTn, and SiZn. The solder metal layer 70 may be electroplated, although, in other embodiments, other processes such as electroless plating or deposition processes such as vapor deposition may also be used. In one embodiment, the solder metal layer 70 may be sputter deposited.

Figure 8:
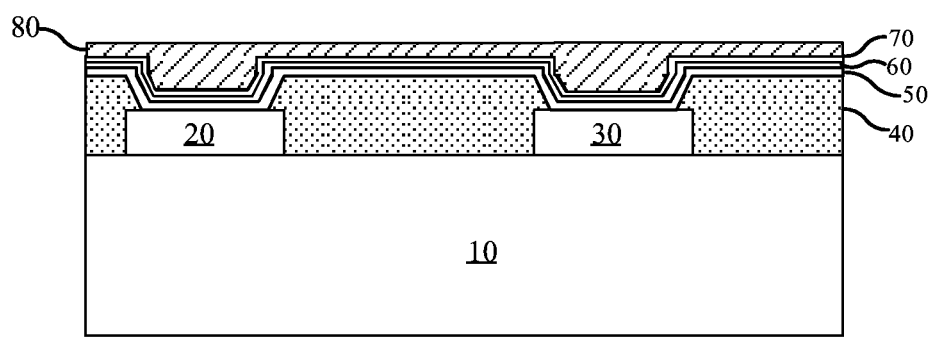
Figure 9:
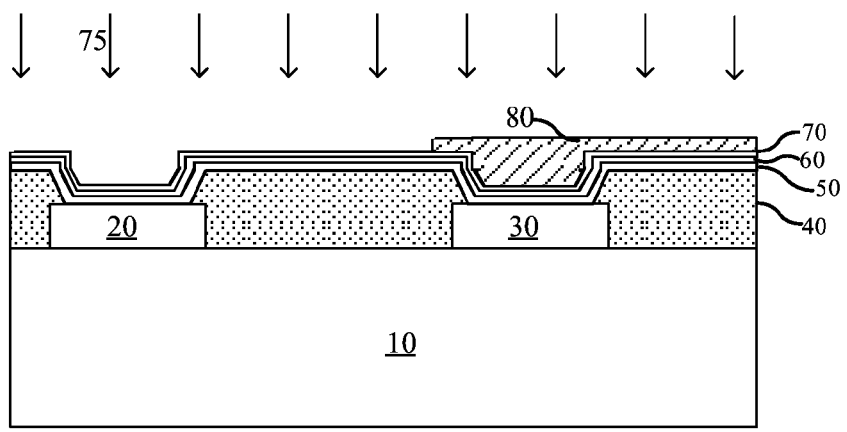
Figure 10:
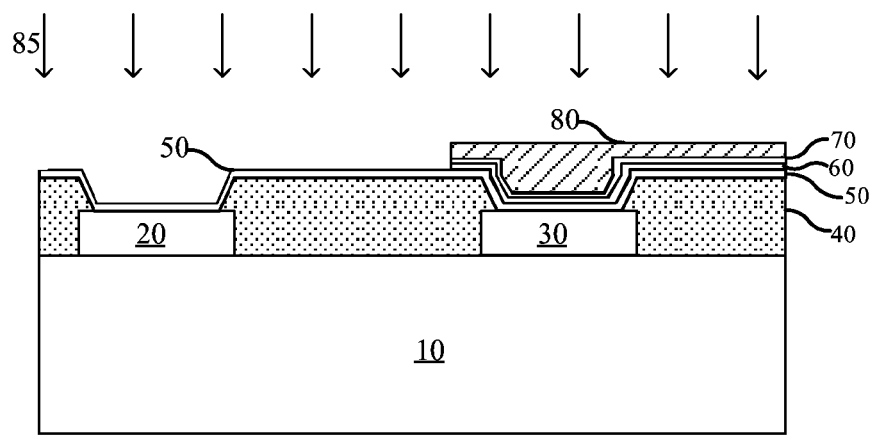
Figure 11:
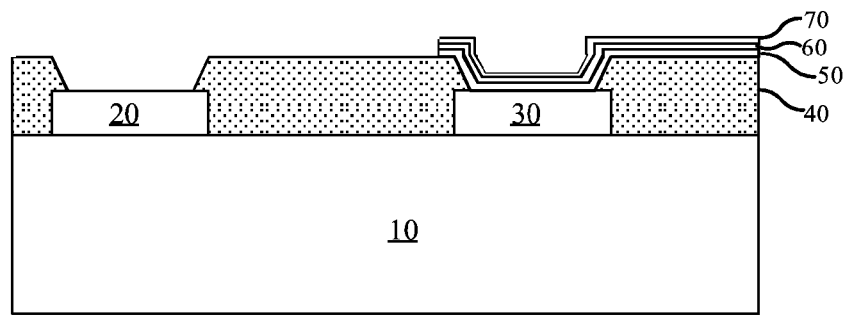

Referring to FIG. 8, a resist 80 is deposited over the substrate 10. The resist 80 may be a positive or a negative photo resist in various embodiments.

The resist 80 is patterned using conventional lithography techniques. After the patterning, the area over the first conductive pad 20 is opened whereas the resist 80 protects the area over the second conductive pad 30. A wet etching process is used to remove the solder metal layer 70 exposed by the patterning of the resist 80. The wet etching process may comprise a mixture of nitric, phosphoric and acetic acid process to etch a solder metal layer 70 comprising silver, as an example.

Next, another wet etching process may be used to remove the solder metal barrier layer 60 exposed after removing the solder metal layer 70. The solder metal barrier layer 60 may be etched using a copper etch chemistry in one or more embodiments.

If the underlying adhesion layer 65 (FIG. 12) is present, the adhesion layer may etched using the same etch chemistry or a different etch chemistry. In one embodiment, an adhesion layer 65 comprising titanium may be etched using dilute HF. In another embodiment, the adhesion layer 65 is selected so that the adhesion layer 65 may be removed without removing the etch stop layer 50. Alternatively, if the adhesion layer 65 is skipped, then the etch chemistry is selected so that the solder metal barrier layer 60 may be removed without removing the etch stop layer 50.

Next, the etch stop layer 50 is removed using a etch chemistry different from the etching of the adhesion layer 65 and/or the solder metal barrier layer 60. In various embodiments, the etch stop layer 50 is etched using a hydrogen peroxide etching process. In various embodiments, hydrogen peroxide is selected because it is selective to the underlying first conductive pad 20. In various embodiments, the etch chemistry is selective relative to the first conductive pad 20 and the etch stop layer 50. In various embodiments, the etch rate of the etch stop layer 50 is much greater than the etch rate of the first conductive pad 20 for the etchant selected to etch the etch stop layer 50. In various embodiments, the etch rate of the etch stop layer 50 is 10 times to 100 times faster than the etch rate of the first conductive pad 20 when exposed to the etchant, for example, hydrogen peroxide, nitric acid, ammonium-peroxide (e.g., ammonium hydroxide and hydrogen peroxide), and/or a $SF_6$ based dry chemical etchant.

In various embodiments, the etching processes may be performed using a single tool, for example, within a same chamber or within multiple chambers or may be processed within multiple tools. In one or more embodiments, the etching processes may be an isotropic process or an anisotropic process. In one embodiment, the etch stop layer 50, the solder metal barrier layer 60, and/or the solder metal layer 70 may be removed using a plasma process such as a reactive ion etching.

In various embodiments, similar processing may be used to form the under bump metallization layers illustrated in FIGS. 2-5.

Figure 12:
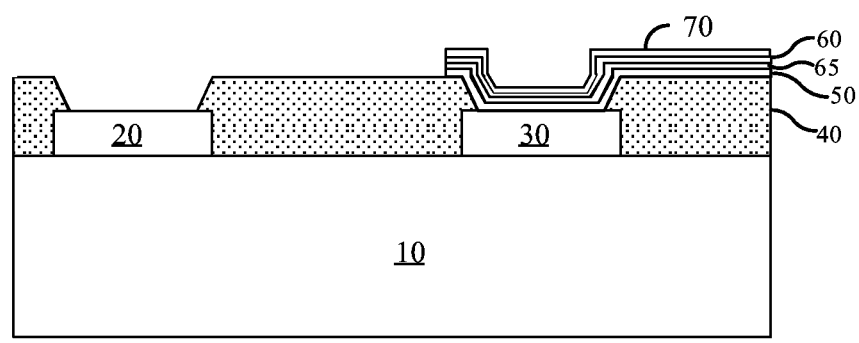
FIG. 12 illustrates an alternative embodiment of the semiconductor device illustrating the additional adhesion layer disposed between the solder barrier layer and the etch stop layer.

FIG. 12 illustrates an alternative embodiment of the semiconductor device illustrating the additional adhesion layer 65 disposed between the solder metal barrier layer 60 and the etch stop layer 50. As described previously, the adhesion layer 65 may be skipped in some embodiments. The adhesion layer 65 may comprise titanium in one or more embodiments.

In various embodiments, a metal layer, which is a layer comprising the metal may be a pure metal, an alloy, a compound, or an inter-metallic. A pure metal layer may also include trace impurities in one or more embodiments. For example, a pad comprising aluminum may include pure aluminum, an aluminum alloy, an aluminum compound, or an inter-metallic material comprising aluminum.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-12 may be combined with each other in alternative embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a device, the method comprising:
   forming a first conductive pad and a second conductive pad over a substrate;
   forming a etch stop layer over the first conductive pad and the second conductive pad;
   forming a solder layer over the etch stop layer, wherein the solder layer is configured to form a solder with another material;
   removing the solder layer from over the first conductive pad using a first etch process; and
   removing the etch stop layer from over the first conductive pad using a second etch process, wherein the second etch process selectively removes the etch stop layer relative to the underlying first conductive pad.

2. The method of claim 1, wherein the etch stop layer is an etch stop layer for the first etch process.

3. The method of claim 1, wherein the first conductive pad is not selective with the etch chemistry of the first etch process.

4. The method of claim 1, wherein the etch stop layer comprises titanium and tungsten, wherein the second etch process comprises an etch chemistry comprising hydrogen peroxide, nitric acid, ammonium-peroxide, and/or a $SF_6$ based dry chemical etchant.

5. The method of claim 1, wherein forming the solder layer over the etch stop layer comprises forming a solder barrier layer over the etch stop layer and forming a solder metal layer over the solder barrier layer.

6. A method of forming a device, the method comprising:
   providing a first conductive pad disposed over a substrate;
   forming an etch stop layer over a top surface of the first conductive pad;
   forming a solder layer over the etch stop layer, wherein forming the solder layer comprises:
      forming a solder barrier layer over the etch stop layer, and
      forming a solder metal layer over the solder barrier layer, wherein the solder metal layer is configured to form a solder with another material; and
   forming a second conductive pad over the substrate, the second conductive pad comprising a different exposed top surface than the first conductive pad.

7. The method of claim 6, further comprising:
   forming an adhesion layer between the etch stop layer and the solder barrier layer.

8. The method of claim 6, wherein the etch stop layer comprises tungsten and titanium.

9. The method of claim 8, wherein the solder barrier layer comprises nickel and vanadium.

10. The method of claim 9, wherein the solder metal layer comprises silver.

11. The method of claim 6, wherein the second conductive pad is configured to be bonded using a technique other than solder bonding.

12. The method of claim 11, wherein the second conductive pad is configured to be wire bonded.

13. The method of claim 1, wherein the first conductive pad and the second conductive pad comprise aluminum or copper.

14. The method of claim 11, wherein a thickness of the second conductive pad is the same as a thickness of the first conductive pad.

15. The method of claim 6, wherein the substrate comprises a semiconductor substrate.

16. The method of claim 6, wherein the substrate comprises a circuit board.

17. The method of claim 6, wherein the substrate comprises a ball grid array substrate.

18. A method of forming a device, the method comprising:
   stacking a first substrate comprising a semiconductor chip and a second substrate comprising another semiconductor chip;
   wire bonding a first conductive pad on the second substrate; and
   soldering a connector to a second conductive pad on the second substrate, wherein a etch stop layer is disposed between the connector and the second conductive pad.

19. The method of claim 18, wherein the first substrate is stacked over the second substrate.

* * * * *